(12) United States Patent
Ko

(10) Patent No.: US 7,871,879 B2
(45) Date of Patent: Jan. 18, 2011

(54) METHOD OF MANUFACTURING SEMICONDUCTOR MEMORY DEVICE

(75) Inventor: Young-Sun Ko, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 337 days.

(21) Appl. No.: 12/124,188

(22) Filed: May 21, 2008

(65) Prior Publication Data

US 2008/0293197 A1    Nov. 27, 2008

(30) Foreign Application Priority Data

May 25, 2007    (KR)    ...................... 10-2007-0050824

(51) Int. Cl.
*H01L 21/8238*    (2006.01)
(52) U.S. Cl. ........................ 438/211; 438/213; 438/257; 257/E21.422
(58) Field of Classification Search ................. 438/211, 438/213, 257; 257/E21.422
See application file for complete search history.

(56) References Cited

U.S. PATENT DOCUMENTS

| | | | | |
|---|---|---|---|---|
| 6,737,321 | B2 * | 5/2004 | Lee | 438/264 |
| 7,473,600 | B2 * | 1/2009 | Yoo et al. | 438/257 |
| 2002/0110973 | A1 * | 8/2002 | Liou et al. | 438/211 |
| 2004/0079984 | A1 * | 4/2004 | Kao et al. | 257/315 |
| 2006/0292781 | A1 * | 12/2006 | Lee | 438/197 |
| 2007/0148870 | A1 * | 6/2007 | Shin | 438/257 |

\* cited by examiner

*Primary Examiner*—Tuan N. Quach
(74) *Attorney, Agent, or Firm*—Sherr & Vaughn, PLLC

(57) ABSTRACT

A method of manufacturing a semiconductor memory device includes forming a device separation film on a semiconductor substrate using a mask pattern for defining an entire source line region as an active region to separate a device separation region from an active region; forming a stack gate structure on the semiconductor substrate; forming a common source line by implanting impurity ions into the semiconductor substrate in the source line region; and performing an impurity ion implantation process on the semiconductor substrate to form a drain region.

19 Claims, 8 Drawing Sheets

METHOD OF MANUFACTURING SEMICONDUCTOR MEMORY DEVICE

The present application claims priority under U.S.C. §119 to Korean Patent Application No. 10-2007-0050824 (filed May 25, 2007), which is hereby incorporated by reference in its entirety.

BACKGROUND OF THE INVENTION

There are known many technologies for forming a source line of a semiconductor memory device, and of these, a self-aligned source process is widely used. During the self-aligned source process, after a stack gate structure is formed, a cell region excluding a common source portion is covered with a photosensitive film, a device separation film at a source line portion is removed by etching, and ion implantation is performed to form a common source line.

Example FIG. 1A illustrates a layout view of a semiconductor memory cell array. Example FIG. 1B illustrates a pattern diagram of an active region in a semiconductor memory cell array. Example FIGS. 2A to 2D illustrate a method of manufacturing a semiconductor memory device taken along the line II-II of example FIG. 1A. Example FIGS. 3A to 3D illustrate a method of manufacturing a semiconductor memory device taken along the line III-III of example FIG. 1A.

As illustrated in example FIGS. 1A, 1B, 2A, and 3A, device separation film 12 may be formed in a device separation region of semiconductor substrate 11. Here, as an active region mask pattern for separating the device separation region from the active region, a linear mask pattern illustrated in example FIG. 1B by which a linear active region and a linear device separation region are formed may be used. Tunnel oxide film 13 and first polysilicon film 14 may then be sequentially formed on and/or over the entire structure and then patterned by a lithography process and an etching process with a floating gate mask, thereby forming a floating gate. Dielectric film 15, second polysilicon film 16, tungsten silicide film 17 and oxide film 18 may then be sequentially formed on and/or over the entire structure and then patterned by a lithography process and an etching process with a control gate mask, thereby forming a control gate. In this way, stack gate structure 20 in which a floating gate and a control gate are laminated is formed. Photosensitive film 19 may then be formed on and/or over the entire structure and then patterned by an exposure process and a development process with a self-aligned source mask, such that a source line portion is exposed.

As illustrated in example FIGS. 1A, 2B, and 3B, a self-aligned source (SAS) etching process may be performed to remove exposed device separation film 12 at the source line portion, such that semiconductor substrate 11 at the source line portion is exposed. After the self-aligned source etching process is completed, a curing process may be performed.

A cell source ion implantation process may be performed with patterned photosensitive film 19 as an ion implantation mask. Then, impurity ions may be implanted into semiconductor substrate 11 at the source line portion, thereby forming a common source line 21, 23.

When device separation film 12 is removed, a residue may remain. Even if ions are implanted during a subsequent process, common source line 21, 23 may not be satisfactorily formed. In addition, as illustrated in example FIG. 3B, since the profiles of common source lines 21, 23 have a step between the active region and the device separation region, they may be formed in a bent shape.

As illustrated in example FIGS. 1A, 2C, and 3C, the entire cell array may be exposed and an impurity ion implantation process performed, thereby forming drain region 22.

As illustrated in example FIGS. 1A, 2D, and 3D, an insulating film may be formed on and/or over the entire structure and an entire surface etching process is performed, thereby forming spacers 24 at the sidewalls of stack gate structure 20.

In accordance with the aforementioned structure, since multiple cells are connected to a single source line, i.e., the common source line is used, source resistance is large, and as a result, a cell current characteristic may be deteriorated. In particular, since the active region mask pattern for separation the device separation region from the active region, the linear pattern illustrated in example FIG. 1B by which a linear active region and a linear device separation region are formed is used, the device separation film is formed on the common source line. Accordingly, a residue may remain when the device separation film is removed so as to form the common source line. As a result, the common source line may not be satisfactorily formed. For this reason, source resistance may be further increased and at worst, the common source line may not be satisfactorily functioned.

SUMMARY OF THE INVENTION

Embodiments relates to a method of manufacturing a semiconductor memory device, and in particular, to a method of manufacturing a semiconductor memory device which reduces source resistance due to a self-aligned source process for high integration, thereby improving a cell current resistance.

Embodiments relates to a method of manufacturing a semiconductor memory device which reduces source resistance and improving a cell current characteristic by using a lattice-shaped mask pattern instead of a linear mask pattern, as an active region mask pattern for separating a device separation region from an active region to define an entire common source line region as an active region and to make the profile of a common source line in a linear shape with no step.

Embodiments relates to a method of manufacturing a semiconductor memory device which simplifies a process without removing a device separation film in order to form a common source line and preventing source resistance from being increased or preventing a common source line from being not satisfactorily functioned because a residue remains when a device separation film is removed.

Embodiments relates to a method of manufacturing a semiconductor memory device that can include at least one of the following steps: forming a device separation film on and/or over a semiconductor substrate by using a mask pattern for defining an entire source line region as an active region to separate a device separation region from an active region; and then forming a stack gate structure, in which a floating gate and a control gate are laminated, on and/or over the semiconductor substrate; and then implanting impurity ions into the semiconductor substrate in the source line region to form a common source line; and then performing an impurity ion implantation process on the semiconductor substrate to form a drain region.

When the device separation film is formed, the device separation film and the active region may be separated from each other with a lattice-shaped active region mask pattern.

The forming of the common source line can include: forming a photosensitive film over the entire structure, in which the stack gate structure is formed, and patterning the photosensitive film by an exposure process and a development process with a self-aligned source mask so as to expose the source line region; and then forming the common source line in the entire exposed source line region.

The common source line can be formed by an impurity ion implantation process with the patterned photosensitive film as an ion implantation mask, such that the common source line has a linear profile.

BRIEF DESCRIPTION OF THE DRAWINGS

Example

Example

Example

Example

Example

Example

DESCRIPTION OF THE PREFERRED EMBODIMENTS

Figure 1A:
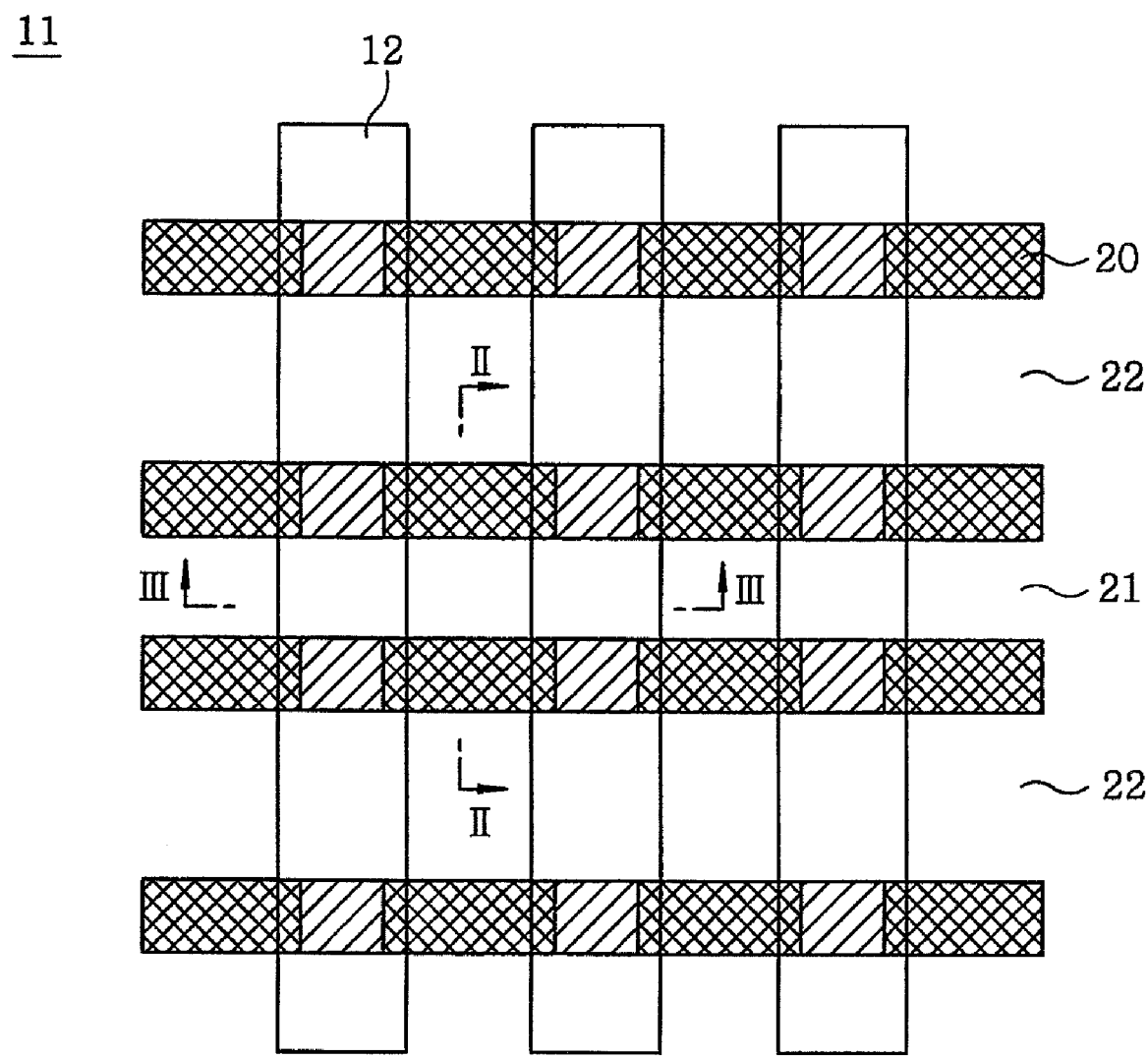
FIGS. 1A and 1B illustrate a semiconductor memory cell array.
Figure 1B:
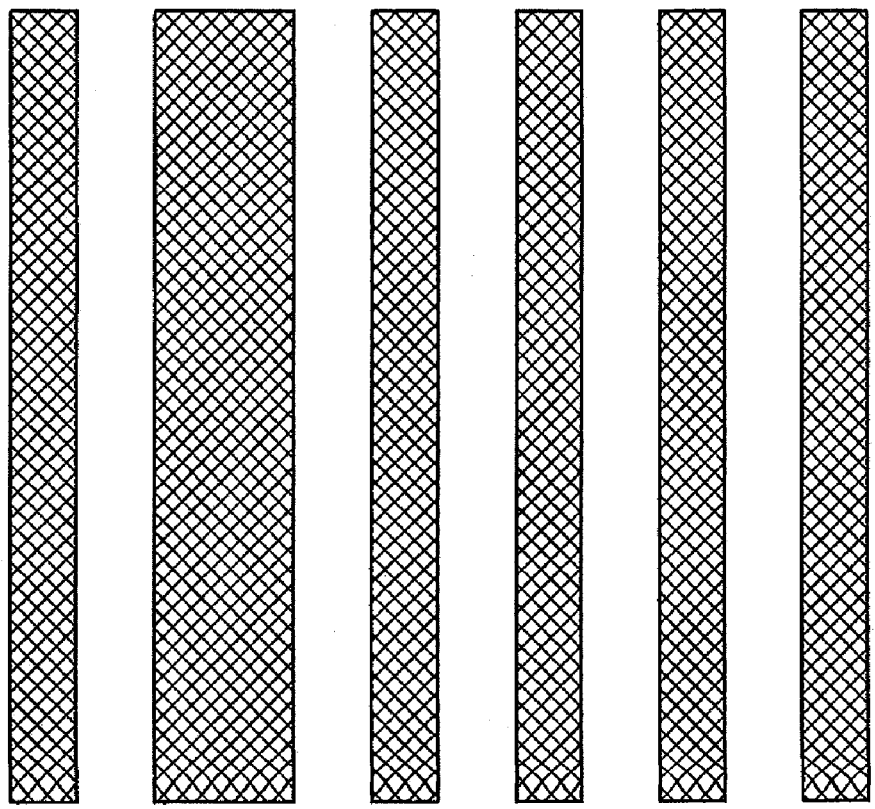
Figure 2A:
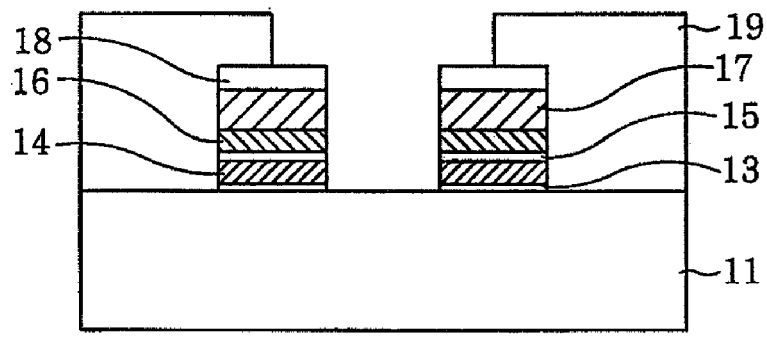
FIGS. 2A to 2D illustrate a method of manufacturing a semiconductor memory device taken along the line II-II of example FIG. 1A.
Figure 2B:
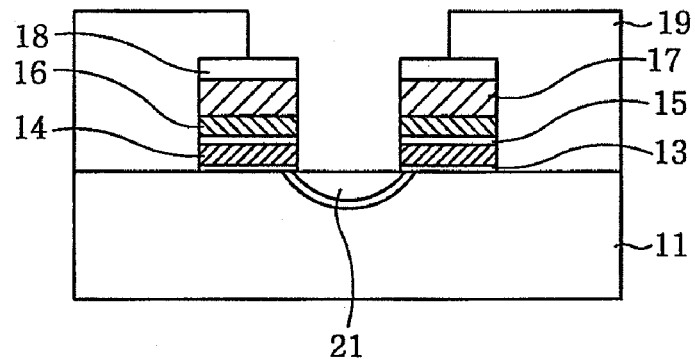
Figure 2C:
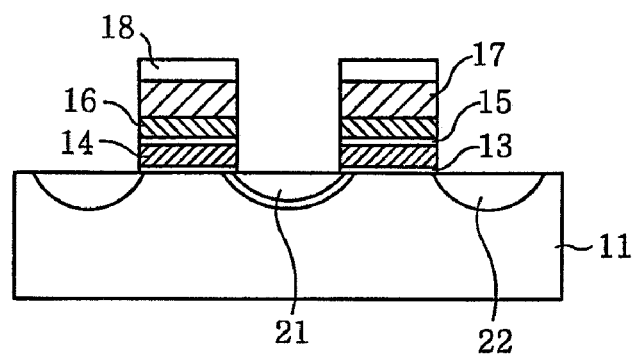
Figure 2D:
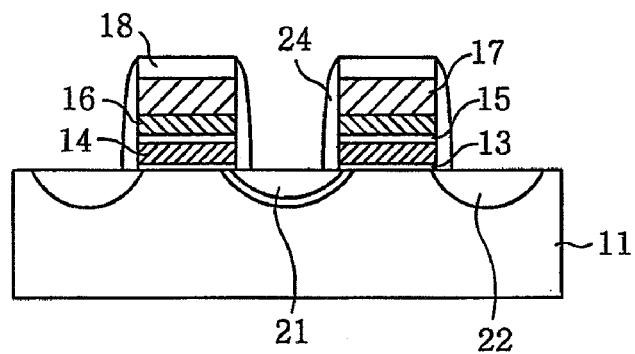
Figure 3A:
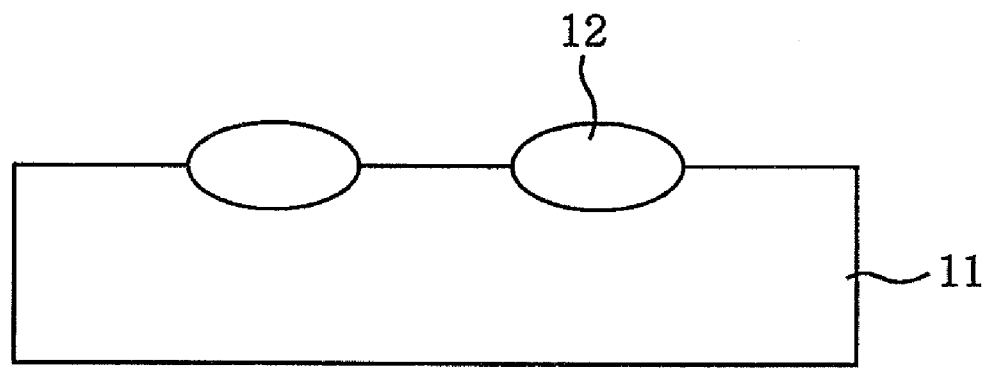
FIGS. 3A to 3D illustrate a method of manufacturing a semiconductor memory device taken along the line III-III of example FIG. 1A.
Figure 3B:
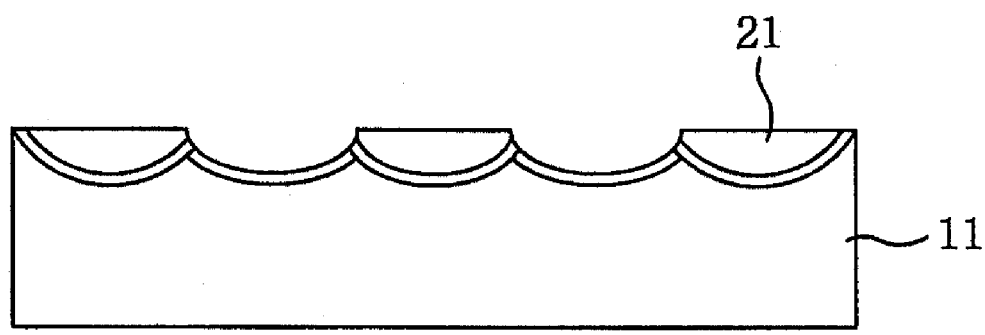
Figure 3C:
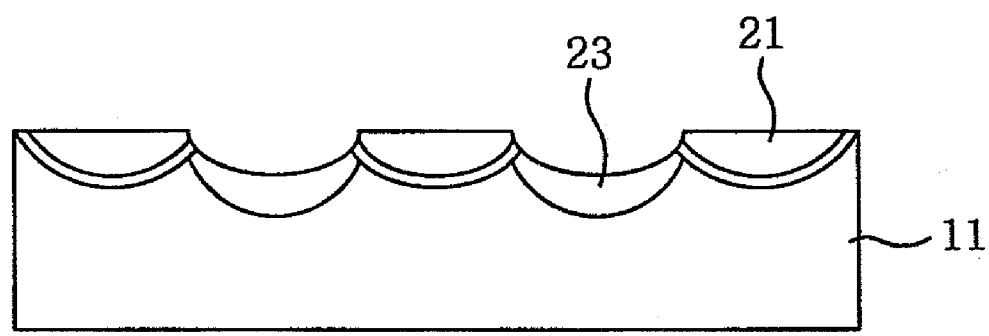
Figure 3D:
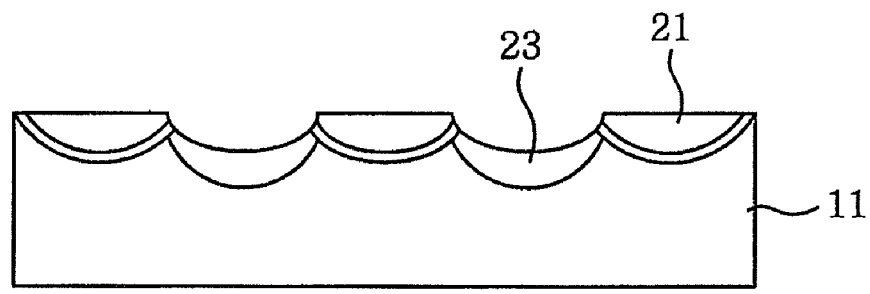

As illustrated in example FIGS. 4A, 4B, 5A, and 6A, device separation film 102 can be formed in a device separation region of semiconductor substrate 101. Here, as an active region mask pattern for separating a device separation region from an active region, a lattice-shaped pattern illustrated in example FIG. 4B can be used. The lattice-shaped pattern defines an entire common source line region as an active region. Tunnel oxide film 103 and first polysilicon film 104 can then be sequentially formed over the entire structure and patterned by a lithography process and an etching process with a floating gate mask, thereby forming a floating gate.

Dielectric film 105, second polysilicon film 106, tungsten silicide film 107 and oxide film 108 can then be sequentially formed on and/or over the entire structure and patterned by a lithography process and an etching process with a control gate mask, thereby forming a control gate. In this way, stack gate structure 120 in which a floating gate and a control gate are laminated is formed. Photosensitive film 109 can then be formed on and/or over the entire structure and then patterned by an exposure process and a development process with a self-aligned source mask so as to expose a source line portion.

Typically, when a device separation film is formed in a common source line region, due to the gap filling property of the device separation film, the profile of the control gate is slanted, i.e., the height of the control gate on the side of the common source line region is lower than the height of the control gate on the side of the drain region, unlike that illustrated in the drawings. In contrast, in accordance with embodiments, a device separation film is not formed in the common source line region, the profile of the control gate is as illustrated in the drawings. Meaning, the height of the control gate on the side of the common source line region is identical to the height of the control gate on the side of the drain region. As such, when the profile of the control gate is improved, tungsten silicide film 107 can be formed uniformly. Therefore, the resistance characteristic of the control gate can be improved.

Figure 4A:
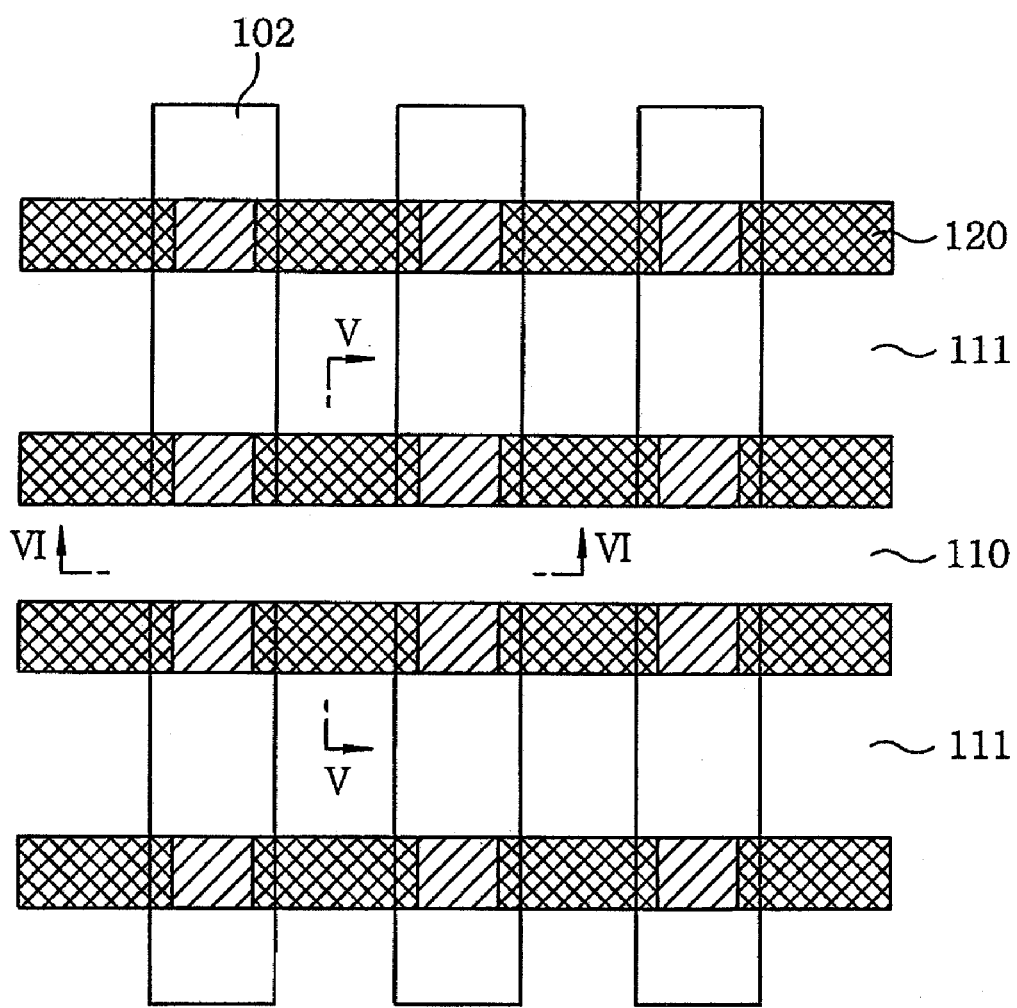
FIGS. 4A and 4B illustrate a semiconductor memory cell array, in accordance with embodiments.
Figure 4B:
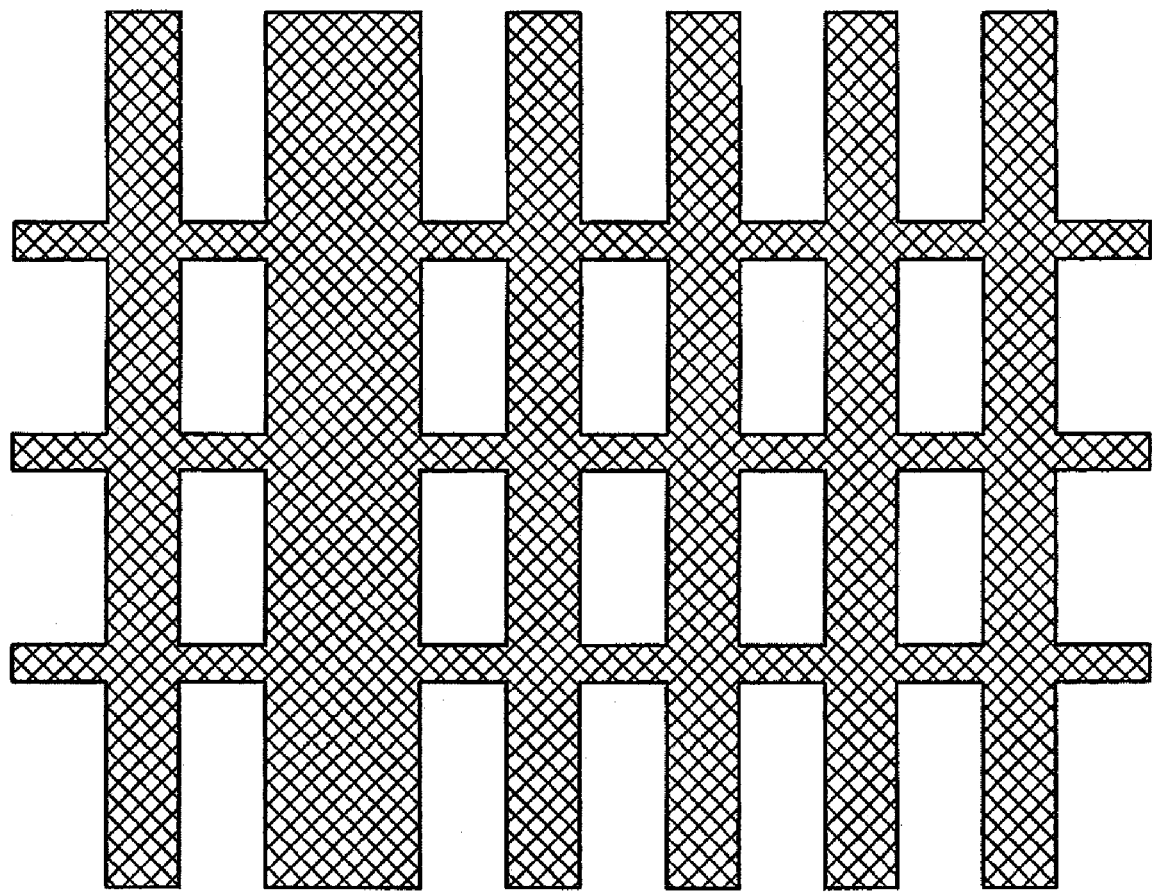
Figure 5A:
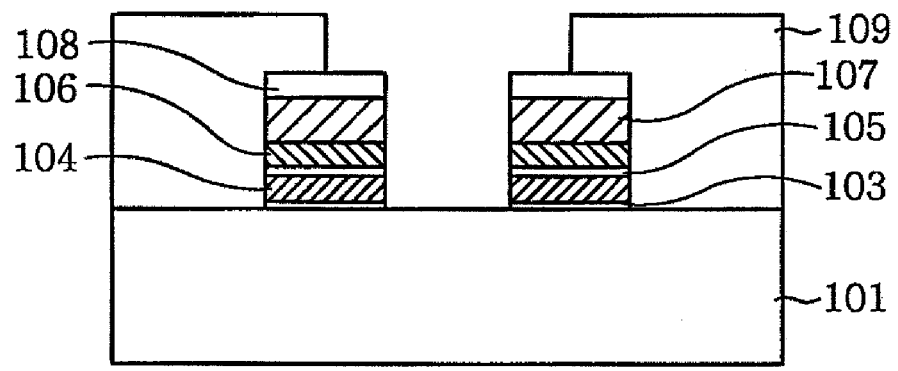
FIGS. 5A to 5D illustrate a method of manufacturing a semiconductor memory device taken along the line V-V of example FIG. 4A, in accordance with embodiments.
Figure 5B:
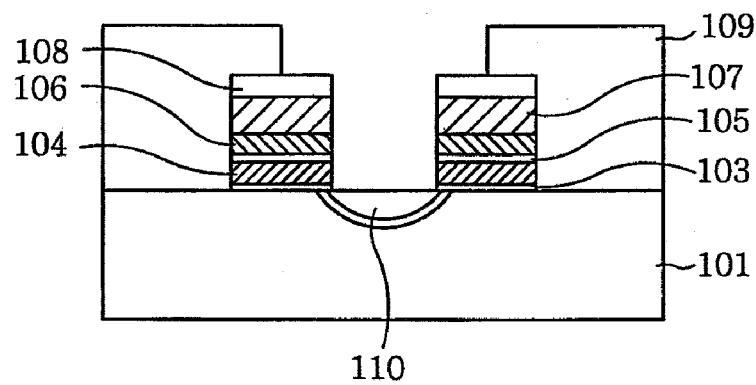
Figure 6A:
FIGS. 6A to 6D illustrate a method of manufacturing a semiconductor memory device taken along the line VI-VI of example FIG. 4A, in accordance with embodiments.
Figure 6B:
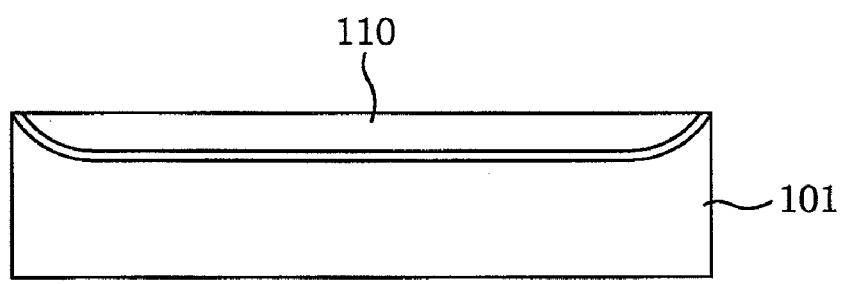

As illustrated in example FIGS. 4A, 5B, and 6B, a self-aligned source process can be performed, i.e., impurity ions implanted into semiconductor substrate 101 at the source line portion with patterned photosensitive film 109 as an ion implantation mask, thereby forming common source line 110.

Typically, the device separation film in the source line region needs to be removed before ion implantation, which may result in residue remaining after removing the device separation film. Accordingly, even if ions are implanted, the common source line may not be satisfactorily formed. For this reason, the source resistance may be further increased and at worst, the common source line may not be satisfactorily functioned.

In contrast, in accordance with embodiments, the entire source line region is defined as an active region. Thus, a step of removing a device separation film is not required, thereby simplifying the manufacturing process. Accordingly, the source resistance is not increased and the common source line may functionality is increased.

Furthermore, typically, in the source line region, a large step exists between the active region and the device separation region. For this reason, the common source line after ion implantation is formed in a bent shape.

In contrast, in accordance with embodiments illustrated in example FIG. 6B, no step exists in the entire source line region, and the profile of common source line 110 is in a linear shape with no step.

Figure 5C:
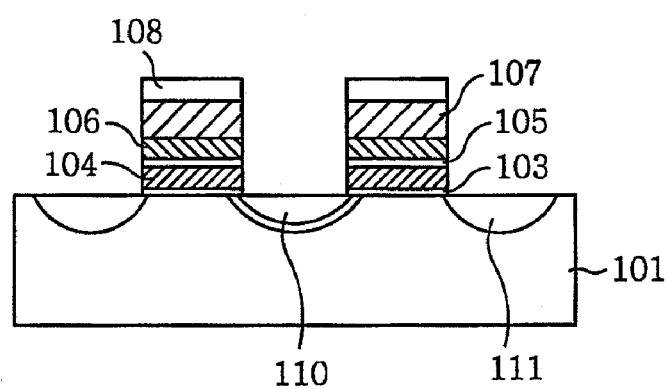
Figure 6C:
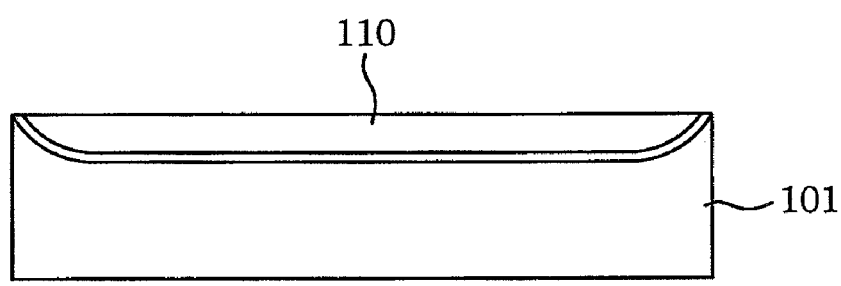

As illustrated in example FIGS. 4A, 5C, and 6C, the entire cell array can be exposed and an impurity ion implantation process is performed, thereby forming drain region 111.

Figure 5D:
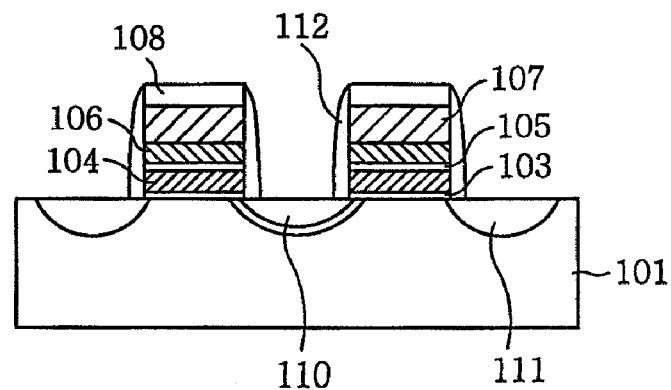
Figure 6D:
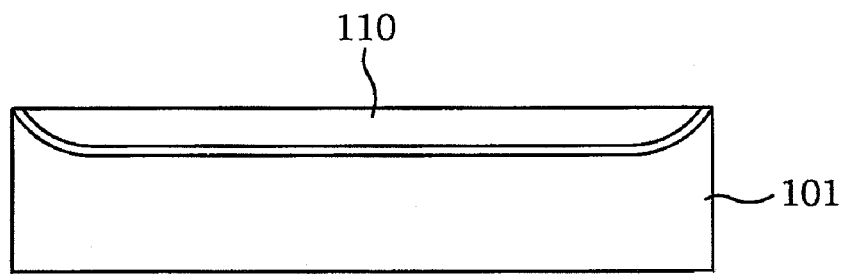

As illustrated in example FIGS. 4A, 5D, and 6D, an insulating film can then be formed on and/or over the entire structure and an entire surface etching process is performed so as to expose common source line 110 and drain region 111, thereby forming spacers 112 on the sidewalls of stack gate structure 120.

As described above, in accordance with embodiments, a lattice-shaped mask pattern is used instead of a linear mask pattern as the active region mask pattern for separating the device separation region from the active region to define the entire common source line as the active region and to make the profile of the common source line in a linear shape with no step. Therefore, the source resistance can be reduced, and the cell current characteristic can be improved, thereby achieving high yield.

Furthermore, when the common source line is formed, it is not necessary to remove the device separation film, and thus the manufacturing process is simplified. In addition, it is possible to prevent source resistance from being increased or to prevent a common source line from being not satisfactorily functioned because a residue remains when a device separation film is removed. The profile of the control gate is improved, and the silicide film is formed uniformly. Therefore, the resistance characteristic of the control gate can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor memory device comprising:
forming a device separation film on a semiconductor substrate using a mask pattern defining a source line region as an active region to separate a device separation region from the active region; and then
forming a stack gate structure including a floating gate and a control gate on the semiconductor substrate; and then
forming a common source line by implanting impurity ions into the semiconductor substrate in the source line region; and then
forming a drain region on the semiconductor substrate by performing an impurity ion implantation process on the semiconductor substrate,
wherein the mask pattern includes a lattice-shaped active region mask pattern.

2. The method of claim 1, wherein forming a common source line comprises:
forming a photosensitive film over the semiconductor substrate including the stack gate structure; and then
patterning the photosensitive film with a self-aligned source mask to expose the source line region; and then
forming the common source line in the exposed source line region.

3. The method of claim 1, wherein the common source line is formed having a linear profile.

4. The method of claim 1, wherein the common source line is formed having a linear profile.

5. The method of claim 1, wherein forming the common source line comprises performing an impurity ion implantation process with the patterned photosensitive film as an ion implantation mask.

6. A method of manufacturing a semiconductor memory device comprising:
separating a device separation region from an active region of the semiconductor substrate using a lattice-shaped mask pattern for defining a source line region as the active region; and then
forming a device isolation film on the semiconductor substrate;
forming a gate structure on the semiconductor substrate; and then
forming a photosensitive film on the semiconductor substrate including the gate structure and patterning the photosensitive film exposing the source line region; and then
forming a common source line in the semiconductor substrate adjacent a sidewall of the gate structure by performing a self-aligned source process.

7. The method of claim 6, wherein forming the common source line comprises implanting impurity ions into the common source line region using the patterned photosensitive film as an ion implantation mask.

8. The method of claim 7, wherein the common source line is formed having a linear profile.

9. The method of claim 6, wherein the common source line is formed having a linear profile.

10. The method of claim 6, further comprising:
forming a drain region in the semiconductor substrate; and then
forming spacers on the sidewalls of the gate structure.

11. The method of claim 10, wherein forming the drain region comprises:
exposing the semiconductor substrate; and then
performing an impurity ion implantation process on the exposed semiconductor substrate.

12. The method of claim 10, wherein forming the drain region comprises:
forming an insulating film on the substrate including the gate structure; and then
performing an etching process exposing the common source line and the drain region.

13. The method of claim 6, wherein the drain region is formed adjacent to a sidewall of the gate structure opposite to the common source line.

14. The method of claim 6, wherein forming the gate structure comprises forming a stack gate structure.

15. The method of claim 14, wherein forming the stack gate structure comprises sequentially forming a floating gate and a control gate.

16. The method of claim 15, wherein sequentially forming the floating gate and the control gate comprises:
sequentially forming a tunnel oxide film and a first polysilicon film on the semiconductor substrate; and then
patterning the tunnel oxide film and the first polysilicon film structure using an etching process with a floating gate mask; and then
sequentially forming a dielectric film, a second polysilicon film, a tungsten silicide film and an oxide film on the floating gate; and then
patterning the dielectric film, the second polysilicon film, the tungsten silicide film and the oxide film using an etching process with a control gate mask.

17. The method of claim 6, wherein forming the gate structure comprises:
sequentially forming a tunnel oxide film and a first polysilicon film on the semiconductor substrate; and then
patterning the tunnel oxide film and the first polysilicon film structure using an etching process with a floating gate mask; and then
sequentially forming a dielectric film, a second polysilicon film, a tungsten silicide film and an oxide film on the floating gate; and then
patterning the dielectric film, the second polysilicon film, the tungsten silicide film and the oxide film using an etching process with a control gate mask.

18. A method of manufacturing a semiconductor memory device comprising:
forming a device isolation film over the entire surface of a semiconductor substrate except a source line region of the semiconductor substrate; and then
forming a gate structure on the semiconductor substrate; and then
forming a photosensitive film on the semiconductor substrate including the gate structure and patterning the photosensitive film exposing the source line region; and then
forming a common source line in the source line region by performing a self-aligned source process; and then
forming a drain region in the semiconductor substrate.

19. The method of claim 18, wherein forming the device isolation film comprises separating a device separation region from the active region of the semiconductor substrate using a lattice-shaped mask pattern for defining a common source line region as the active region.

* * * * *